(12) United States Patent
Bae et al.

(10) Patent No.: US 8,755,240 B2
(45) Date of Patent: Jun. 17, 2014

(54) OPTICAL MEMORY DEVICE AND METHOD OF RECORDING/REPRODUCING INFORMATION BY USING THE SAME

(75) Inventors: Jae-Cheol Bae, Suwon-si (KR); Joo-Ho Kim, Suwon-si (KR); Jin-Kyung Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 80 days.

(21) Appl. No.: 13/321,850

(22) PCT Filed: Apr. 14, 2010

(86) PCT No.: PCT/KR2010/002281
§ 371 (c)(1),
(2), (4) Date: Nov. 22, 2011

(87) PCT Pub. No.: WO2010/134697
PCT Pub. Date: Nov. 25, 2010

(65) Prior Publication Data
US 2012/0063253 A1    Mar. 15, 2012

(30) Foreign Application Priority Data
May 22, 2009   (KR) .............. 10-2009-0045207

(51) Int. Cl.
*G11C 7/00* (2006.01)
*H01L 27/146* (2006.01)
*H01L 33/06* (2010.01)

(52) U.S. Cl.
CPC .... *H01L 27/14603* (2013.01); *H01L 27/14609* (2013.01); *H01L 27/14601* (2013.01); *H01L 27/14647* (2013.01); *H01L 33/06* (2013.01)
USPC ............. 365/215; 257/14; 257/17; 257/21; 257/441

(58) Field of Classification Search
CPC ............... H01L 27/14603; H01L 27/14609; H01L 27/14601; H01L 27/14647; H01L 33/06
USPC ............. 365/215; 257/14, 17, 21, 441
See application file for complete search history.

(56) References Cited

U.S. PATENT DOCUMENTS 5,936,258 A * 8/1999 Imamura et al. ............... 257/21
6,011,271 A * 1/2000 Sakuma et al. ................ 257/14

(Continued)

FOREIGN PATENT DOCUMENTS

CN    101038946 A    9/2007
CN    101271947 A    9/2008

(Continued)

OTHER PUBLICATIONS

Communication, dated Jan. 17, 2013, issued by the European Patent Office in counterpart European Application No. 10777884.7
Bian Song-Bao et al, "Photon-Storage in Optical Memory Cells Based on a Semiconductor Quantum Dot-Quantum Well Hybrid Structure," Chinese Physics Letters, vol. 20, No. 8, Aug. 1, 2003, pp. 1362-1365.

(Continued)

Primary Examiner — Viet Q Nguyen
(74) Attorney, Agent, or Firm — Sughrue Mion, PLLC

(57) ABSTRACT

An optical memory device and a method of recording/reproducing information by using the optical memory device. The optical memory device includes a substrate; a first barrier layer formed on the substrate; a quantum well layer; a second barrier layer; a quantum dot layer; and a third barrier layer. The quantum well layer has an energy band gap which is wider than that of the quantum dot layer, and the second barrier layer has an energy band gap which is wider than that of the quantum well layer, so that electrons in excitons which are generated in the quantum dot layer by light of a certain wavelength are captured by the quantum well layer to record information, and then, recorded information may be erased or reproduced by irradiating light of a certain wavelength to the optical memory device.

34 Claims, 5 Drawing Sheets

(56) References Cited

U.S. PATENT DOCUMENTS

| | | | |
|---|---|---|---|
| 6,600,169 B2 * | 7/2003 | Stintz et al. | 257/14 |
| 6,614,086 B2 * | 9/2003 | Kim et al. | 257/438 |
| 6,720,589 B1 * | 4/2004 | Shields | 257/194 |
| 7,282,732 B2 * | 10/2007 | Gray et al. | 257/14 |
| 7,745,816 B2 * | 6/2010 | Mohseni | 257/21 |
| 7,795,609 B2 * | 9/2010 | Huffaker et al. | 257/14 |

FOREIGN PATENT DOCUMENTS

| | | |
|---|---|---|
| EP | 0447815 A2 | 9/1991 |
| JP | 9-326474 A | 12/1997 |
| JP | 2005-277263 A | 10/2005 |
| JP | 2005-310274 A | 11/2005 |

OTHER PUBLICATIONS

International Search Report [PCT/ISA/210], dated Nov. 24, 2010, issued by the International Searching Authority in International Application No. PCT/KR2010/002281.

Written Opinion [PCT/ISA/237], dated Nov. 24, 2011, issued by the International Searching Authority in International Application No. PCT/KR2010/ 002281.

Communication, dated Nov. 5, 2013, issued by the State Intellectual Property Office of P.R. China in counterpart Chinese Patent Application No. 201080022561.1.

Kroutvar, Miro, et al., "Optically programmable electron spin memory using semiconductor quantum dots," Nature Publishing Group, Nature, vol. 432, Nov. 4, 2004, pp. 81-84.

* cited by examiner

OPTICAL MEMORY DEVICE AND METHOD OF RECORDING/REPRODUCING INFORMATION BY USING THE SAME

CROSS-REFERENCE TO RELATED APPLICATIONS

This application is a national phase entry of PCT/KR2010/002281, which was filed on Apr. 14, 2010, and claims the benefit of priority from Korean patent application No. 10-2009-0045207, which was filed on May 22, 2009, the disclosures of which are incorporated herein by reference in their entirety.

TECHNICAL FIELD

Devices and methods consistent with exemplary embodiments relate to an optical memory device and a method of recording/reproducing information by using the optical memory device, and more particularly, to a device and a method of recording/reproducing information by using optical characteristics of quantum dots.

BACKGROUND

Due to the rapid development in information communication technologies, the amount of information or a transmission capacity of a network has greatly increased. High speed and large capacity transmission on the network is realized using optical fibers, however, optical signals are converted into electric signals at nodes of the network for processing information.

Since optical signals are converted into electric signals, the communication speed on the network is limited. Therefore, optical information processing technology, which may process the information without converting the optical signals to the electric signals, is advantageous.

An optical memory device, e.g., a memory which may record/reproduce information by using light, is important in the field of optical information processing technology. Various types of optical memory devices have been suggested, however, an optical memory device having a structure having recording/reproducing properties and which may substitute conventional memories has not been suggested.

SUMMARY

One or more exemplary embodiments provide an optical memory device in which information may be recorded/reproduced repeatedly by using quantum dots as recording media.

According to an aspect of an exemplary embodiment, there is provided an optical memory device including: a substrate; a first barrier layer formed on the substrate; a quantum well layer formed on the first barrier layer, and having an energy band gap which is narrower than an energy band gap of the first barrier layer; a second barrier layer formed on the quantum well layer, and having an energy band gap which is wider than the energy band gap of the quantum well layer and narrower than the energy band gap of the first barrier layer; a quantum dot layer including a plurality of quantum dots formed on the second barrier layer, and having an energy band gap which is narrower than the energy band gap of the quantum well layer; and a third barrier layer formed on the quantum dot layer, and having an energy band gap which is wider than the energy band gap of the second barrier layer.

A difference between a conduction band of the second barrier layer and a conduction band of the quantum dot layer may be smaller than the energy band gap of the quantum dot layer.

A difference between the conduction band of the second barrier layer and the conduction band of the quantum dot layer may be smaller than a difference between a conduction band of the third barrier layer and a conduction band of the quantum well layer.

The optical memory device may further include a light source which irradiates light of different wavelengths in operations of recording information, erasing recorded information, and reproducing recorded information.

The light source may simultaneously irradiate a first light having an energy which is equal to or greater than the energy band gap of the quantum dot layer and a second light having an energy which is greater than the difference between the conduction band of the second barrier layer and the conduction band of the quantum dot layer in the recording operation of the information. The first light may have an energy which is smaller than the energy band gap of the quantum well layer. The second light may have an energy which is smaller than the energy band gap of the quantum dot layer.

The light source may irradiate a first light having the energy which is equal to or greater than the sum of the energy band gap of the quantum dot layer and the difference between the conduction bands of the second barrier layer and the quantum dot layer in the recording operation of information. The first light may have an energy which is smaller than the energy band gap of the quantum well layer.

The light source may irradiate a third light having an energy which is equal to or greater than the difference between the conduction band of the second barrier layer and the conduction band of the quantum well layer in the erasing of information. The third light may have an energy which is smaller than the difference between the conduction band of the first barrier layer and the conduction band of the quantum well layer.

The light source may irradiate a fourth light having an energy which is smaller than the difference between the conduction band of the second barrier layer and the conduction band of the quantum well layer in the reproducing of information.

The optical memory device may further include a photodetector which detects emitted light which has an energy lower than the energy of the fourth light when the fourth light is irradiated.

The optical memory device may further include a photodetector detecting the transmitted fourth light when the fourth light is irradiated from the light source.

The optical memory device may further include a voltage source which generates differences between electric potentials of the first barrier layer, the quantum well layer, the second barrier layer, the quantum dot layer, and the third barrier layer. The optical memory device may further include an upper electrode disposed on the third barrier layer to be electrically connected to the voltage source. The substrate may be formed of a conductive material and electrically connected to the voltage source.

The voltage source may apply a reverse bias voltage which makes the electric potential of the quantum well layer higher than that of the quantum dot layer in the recording of information.

The voltage source may apply a forward bias voltage which makes the electric potential of the quantum well layer lower than that of the quantum dot layer in the erasing of information.

The first barrier layer, the second barrier layer, the third barrier layer, the quantum well layer, and the quantum dot layer may be formed of a GaAs-based compound semiconductor.

The optical memory device may further include a capping layer formed on the third barrier layer.

According to another aspect of an exemplary embodiment, there is provided a method of recording/reproducing information in/from an optical memory device, which includes a substrate; a first barrier layer formed on the substrate; a quantum well layer formed on the first barrier layer, and having an energy band gap which is narrower than an energy band gap of the first barrier layer; a second barrier layer formed on the quantum well layer, and having an energy band gap which is wider than the energy band gap of the quantum well layer and narrower than the energy band gap of the first barrier layer; a quantum dot layer including a plurality of quantum dots formed on the second barrier layer, and having an energy band gap which is narrower than the energy band gap of the quantum well layer; and a third barrier layer formed on the quantum dot layer, and having an energy band gap which is wider than the energy band gap of the second barrier layer, the method includes irradiating light of different wavelengths in operations of recording information, erasing recorded information, and reproducing recorded information.

In the recording of information, a first light having an energy which is equal to or greater than the energy band gap of the quantum dot layer and a second light having an energy which is greater than the difference between the conduction band of the second barrier layer and the conduction band of the quantum dot layer may be irradiated to the optical memory device.

The first light may have an energy which is smaller than the energy band gap of the quantum well layer. The second light may have an energy which is smaller than the energy band gap of the quantum dot layer.

The first light having the energy which is equal to or greater than sum of the energy band gap of the quantum dot layer and the difference between the conduction bands of the second barrier layer and the quantum dot layer may be irradiated to the optical memory device in the recording of information. The first light may have an energy which is smaller than the energy band gap of the quantum well layer.

A third light having an energy which is equal to or greater than the difference between the conduction band of the second barrier layer and the conduction band of the quantum well layer may be irradiated to the optical memory device in the erasing of information. The third light may have an energy which is smaller than the difference between the conduction band of the first barrier layer and the conduction band of the quantum well layer.

A fourth light having an energy which is smaller than the difference between the conduction band of the second barrier layer and the conduction band of the quantum well layer may be irradiated to the optical memory device in the reproducing of information.

When the fourth light is irradiated, the emitted fourth light which has an energy lower than the energy of the fourth light may be detected.

When the fourth light is irradiated, the fourth light which transmits through the optical memory device may be detected.

Differences may be generated between electric potentials of the first barrier layer, the quantum well layer, the second barrier layer, the quantum dot layer, and the third barrier layer. A reverse bias voltage which makes the electric potential of the quantum well layer higher than that of the quantum dot layer may be applied to the optical memory device in the recording of information. A forward bias voltage which makes the electric potential of the quantum well layer lower than that of the quantum dot layer may be applied to the optical memory device in the erasing of information.

BRIEF DESCRIPTION OF DRAWINGS

The above and other features and/or advantages will become more apparent by describing in detail exemplary embodiments with reference to the attached drawings in which.

DESCRIPTION OF EXEMPLARY EMBODIMENTS

Figure 1:
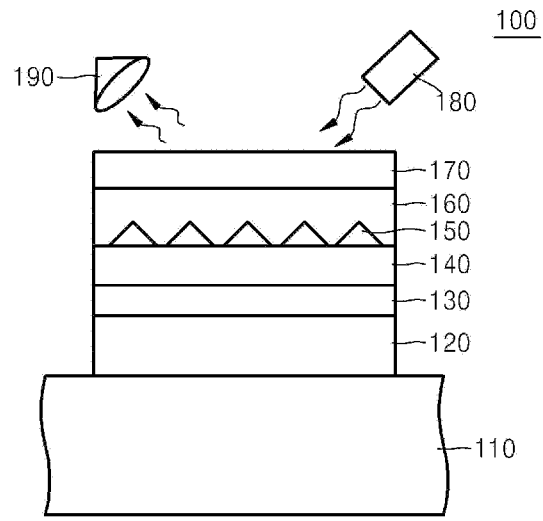
FIG. 1 is a cross-sectional view of an optical memory device according to an exemplary embodiment.

Exemplary embodiments will now be described more fully with reference to the accompanying drawings. Exemplary embodiments may, however, be embodied in many different forms and should not be construed as being limited to the embodiments set forth herein; rather, these exemplary embodiments are provided so that this disclosure will be thorough and complete, and will fully convey the concept of the exemplary embodiments to those of ordinary skill in the art. In the drawings, the thicknesses of layers and regions are exaggerated for clarity. Like reference numerals in the drawings denote like elements, and thus their description will be omitted.

Figure 2:
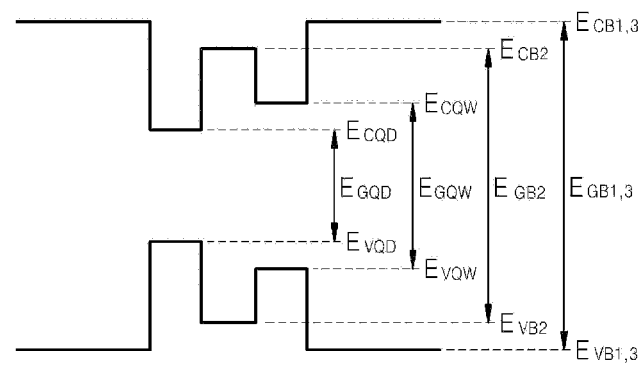
FIG. 2 is a diagram showing energy bands of the optical memory device of FIG. 1 in a non-recorded status.
Figure 3:
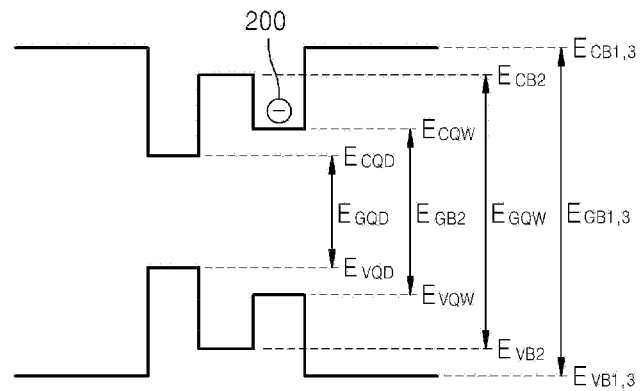
FIG. 3 is a diagram showing energy bands of the optical memory device of FIG. 1 in a recorded status.

FIG. 1 is a cross-sectional view of an optical memory device 100 according to an exemplary embodiment, and FIGS. 2 and 3 are diagrams showing energy bands in the optical memory device 100 of FIG. 1 in a non-recorded status and a recorded status, respectively.

Referring to FIG. 1, the optical memory device 100 of the present exemplary embodiment includes a substrate 110, a first barrier layer 120, a quantum well layer 130, a second barrier layer 140, a quantum dot layer 150, a third barrier layer 160, and a capping layer 170 which are sequentially stacked on the substrate 110. In addition, the optical memory device 100 of the present exemplary embodiment may further include a light source 180 irradiating light for recording/ reproducing, and a photodetector 190 detecting reflected light. The optical memory device 100 may have an array of cells, each of which has unit information recorded thereon, and in this exemplary embodiment, each of the cells may be understood as the stacked structure of the first to third barrier layers 120, 140, and 160, the quantum well layer 130, and the quantum dot layer 150 which are formed on the substrate 110.

The substrate 110 performs as a ground of the optical memory device 100, and may be formed of a compound semiconductor such as GaAs.

The first to third barrier layers 120, 140, and 160 prevent electrons (refer to 200 of FIG. 4) from being released out of the quantum well layer 130 or the quantum dot layer 150 due to thermal energy. The first barrier layer 120 may be formed of a material having an energy band gap which is equal to or wider than that of the substrate 110. The material of the first barrier layer 120 or other layers may vary depending on a wavelength band of the irradiated light from the light source 180. For example, the first barrier layer 120 may be formed of a compound semiconductor such as GaAs or AlGaAs. The second barrier layer 140 may be formed of a material having an energy band gap which is narrower than that of the first barrier layer 120 and wider than that of the quantum well layer 130. For example, the second barrier layer 140 may be formed of a compound semiconductor such as GaAs. The third barrier layer 160 may be formed of a material having an energy band gap which is wider than that of the second barrier layer 140 and wider than that of the quantum dot layer 150. For example, the third barrier layer 160 may be formed of a compound semiconductor such as GaAs or AlGaAs. The first to third barrier layers 120, 140, and 160 may be formed to a thickness of about 10 nm to about 20 nm.

The quantum well layer 130 blocks electrons which represent a recording status of the optical memory device 100, as will be described later. The quantum well layer 130 may be formed of a compound semiconductor such as InGaAs, and may be formed to a thickness of about 10 nm to about 20 nm.

A plurality of quantum dots are arranged in the quantum dot layer 150. The quantum dots generate electrons in a recording mode of the optical memory device 100 by the irradiated light of the light source 180. The quantum dots may be formed by using equipment such as molecular beam epitaxy. For example, the quantum dots may be formed of InGaAs, and each of the quantum dots may have a width of about 10 nm to about 30 nm and a height of about 2 nm to about 5 nm. The quantum dots may be formed in a regular two-dimensional arrangement structure by using a self-assembly method.

The capping layer 170 protects the lower layers, and may be formed of a material through which light is transmitted.

Referring to FIGS. 2 and 3, the first through third barrier layers 120, 140, and 160, the quantum well layer 130, and the quantum dot layer 150 may have energy band gaps which satisfy the following Inequality 1 and Inequality 2.

$$E_{GB1}, E_{GB3} > E_{GB2} > E_{GQW} > E_{GQD} \quad (1)$$

$$E_{GQD} > E_{CB2} - E_{CQD} > E_{GB3} - E_{CQW} \quad (2)$$

In Inequalities 1 and 2, $E_{GB1}$ denotes the energy band gap of the first barrier layer 120, $E_{GB2}$ denotes the energy band gap of the second barrier layer 140, and $E_{GB3}$ denotes the energy band gap of the third barrier layer 160. $E_{GQW}$ denotes the energy band gap of the quantum well layer 130, and $E_{GQD}$ denotes the energy band gap of the quantum dot layer 150. $E_{CB2}$ denotes a conduction band of the second barrier layer 140, and $E_{CB3}$ denotes a conduction band of the third barrier layer 160. In addition, $E_{CQD}$ denotes a conduction band of the quantum dot layer 150, and $E_{CQW}$ denotes a conduction band of the quantum well layer 130.

The light source 180 irradiates light of different wavelengths in a mode of recording information, a mode of erasing recorded information, and a method of reproducing recorded information. The different wavelengths of the light irradiated in the recording, erasing, and reproducing operations will be described later. The light source 180 may include at least one laser diode, for example. In the optical memory device 100 of the present exemplary embodiment, the light source 180 may not be separately formed, but the light may be directly transmitted from the outside through optical fibers. In the optical memory device 100, the light source 180 includes an embodiment where the light is input in the optical memory device 100 through the optical fibers.

The photodetector 190 is disposed on the optical memory device 100 to detect the light of a predetermined wavelength, which is emitted when the information is reproduced. A reflective layer (not shown) may be further disposed on a lower or an upper portion of the substrate 110 to reflect the light emitted during the information reproducing operation to the photodetector 190. If necessary, the photodetector 190 may be disposed under the optical memory device 100 to detect transmitted light. The photodetector 190 may have a structure in which a photo diode or a phototransistor is disposed on each cell. In the optical memory device 100 of the present exemplary embodiment, the photodetector 190 may not be formed as an additional device and the light may instead be emitted to the outside through optical fibers. The photodetector 190 of the present exemplary embodiment may include an embodiment where the light is directly output through the optical fibers.

The first to third barrier layers 120, 140, and 160, the quantum well layer 130, and the quantum dot layer 150 are divided into cell units, and thus, the information may be recorded/reproduced by a cell unit. In this exemplary embodiment, a plurality of light sources 180 and a plurality of photodetectors 190 may be arranged to process the information in a plurality of cells simultaneously or sequentially. The light sources 180 and the photodetectors 190 may be optically connected to the cells via the optical fibers, or may be disposed directly on the capping layer 170.

In addition, operations of recording information, erasing information, and reproducing information of the optical memory device 100 of the present exemplary embodiment will be described with reference to FIGS. 2 through 7.

The recording operation of the optical memory device 100 will be described as follows.

Figure 4:
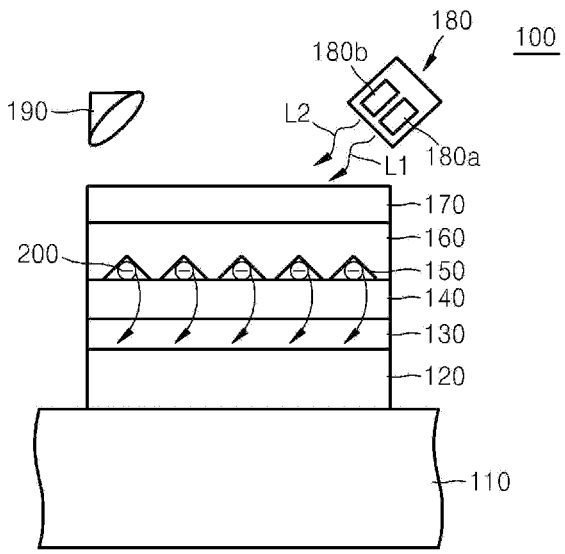
FIG. 4 is a cross-sectional view of the optical memory device of FIG. 1, operating in a recording mode.
Figure 5:
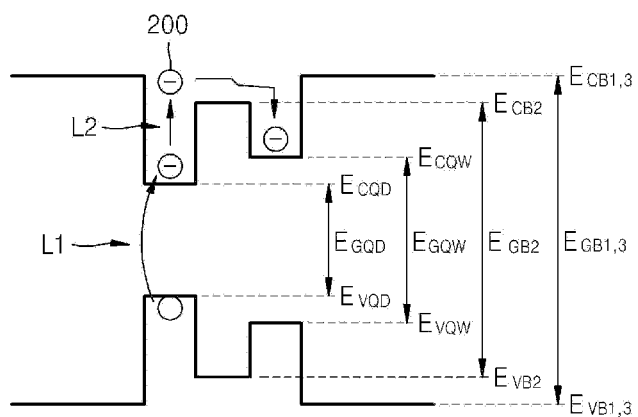
FIG. 5 is a diagram showing energy bands in the recording operation of the optical memory device of FIG. 1.

FIG. 2 shows the optical memory device 100 in a non-recorded state where there is no electron in the quantum well layer 130, and FIG. 3 shows the optical memory device 100 in a recorded state where an electron 200 is in the quantum well layer 130. In addition, FIG. 4 is a cross-sectional view of the optical memory device of FIG. 1, operating in a recording mode, and FIG. 5 is a diagram showing energy bands in the recording operation of the optical memory device 100 of FIG. 1.

As shown in FIG. 2, in the non-recorded state of the optical memory device 100, electrons are not captured in the quantum well layer 130. A first light L1 and a second light L2 are irradiated onto the optical memory device 100 in the non-recorded state. To this end, the light source 180 may include at least two light source elements, that is, a first light source element 180*a* and a second light source element 180*b* (see FIG. 4). The first light L1 may have energy $E_{W1}$ which satisfies the following Equation 3.

$$E_{GQW} > E_{W1} = h\nu_1 \geq E_{GQD} \quad (3)$$

where h denotes the Planck constant, and $\nu_1$ denotes the frequency of the first light L1. The frequency $\nu_1$ of the first light L1 may be determined by Equation 3. The irradiated first light L1 forms excitons, which are electron-hole pairs, in the quantum dot layer 150. In addition, since the excited electron 200 has an energy band gap which is equal to or greater than the energy band gap $E_{GQD}$ of the quantum dot layer 150, the electron 200 jumps from a valence band to a conduction band, accordingly. On the other hand, the energy $E_{W1}$ of the irradiated first light L1 is smaller than the energy band gap $E_{GQW}$ of the quantum well layer 130, and thus, the excitons are not generated in the quantum well layer 130 and are generated only in the quantum dot layer 150.

The second light L2 irradiated with the first light L1 has energy $E_{W2}$ which satisfies the following Equation 4.

$$E_{GQD} > E_{W2} = h\nu_2 > E_{CB2} - E_{CQD} \quad (4)$$

A frequency $\nu_2$ of the second light L2 may be determined by Equation 4. The irradiated second light L2 applies the energy $E_{W2}$ to the electrons 200 in the conduction band of the quantum dot layer 150 so that the electrons 200 may jump over an energy barrier of the second barrier layer 140 to move to the quantum well layer 130. Some of the electrons 200 that obtained the energy $E_{W1}$ and $E_{W2}$ are captured by the quantum well layer 130 to change a state of the corresponding cell of the optical memory device 100 to the recorded state.

On the other hand, the energy $E_{W2}$ of the irradiated second light L2 is smaller than the energy band gap $E_{GQD}$ of the quantum dot layer 150, and thus, the electrons 200 in the valence band of the quantum dot layer 150 do not jump to the conduction band.

As described above, when the first light L1 having the energy $E_{W1}$ and the second light L2 having the energy $E_{W2}$ are irradiated simultaneously, the optical memory device 100 is changed to the recorded state from the non-recorded state. The optical memory device 100 of the present exemplary embodiment may have the structure in which the first through third barrier layers 120, 140, and 160, the quantum well layer 130, and the quantum dot layer 150 are divided into the plurality of cells, and the information may be recorded or not be recorded by the cell unit. The non-recorded state and the recorded state may respectively correspond to "0" and "1."

Next, the operation of erasing the recorded information in the optical memory device 100 will be described as follows.

Figure 6:
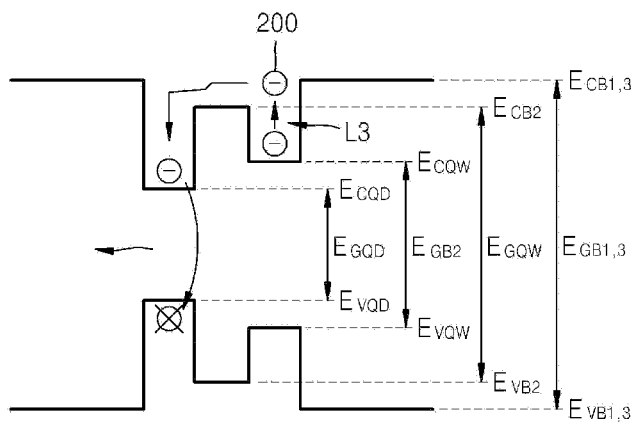
FIG. 6 is a diagram showing energy bands in the erasing operation of the optical memory device of FIG. 1.

FIG. 6 is a diagram showing energy bands in the erasing operation of the optical memory device 100 of FIG. 1.

As shown in FIG. 3, in the optical memory device 100, which is in the recorded state, the electrons 200 are captured in the quantum well layer 130. A third light L3 is irradiated to the optical memory device 100 in the recorded state. The third light L3 has energy $E_{W3}$ which satisfies the following Equation 5.

$$E_{CB1} - E_{CQW} > E_{W3} = h\nu_3 \geq E_{CB2} - E_{CQW} \quad (5)$$

A frequency $\nu_3$ of the third light L3 may be determined by Equation 5. The irradiated third light L3 applies the energy $E_{W3}$ to the electrons 200 captured in the quantum well layer 130 so that the electrons may jump over the energy barrier of the second barrier layer 140 and move to the quantum dot layer 150. The electrons 200 that moved to the quantum dot layer 150 are recombined with holes in the quantum dot layer 150 to emit light. As described above, when the third light L3 having the energy $E_{W3}$ is irradiated, the optical memory device 100 may be changed to the non-recorded state from the recorded state. Therefore, new information may be re-recorded in the optical memory device 100 by erasing the information recorded in the optical memory device 100.

Next, the operation of reproducing information in the optical memory device 100 of the present exemplary embodiment will be described.

Figure 7:
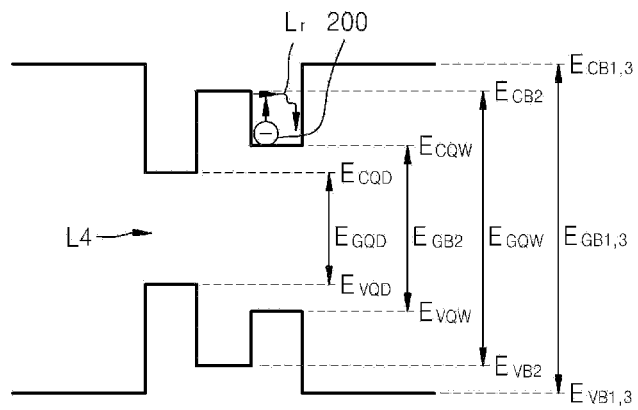
FIG. 7 is a diagram showing energy bands in the reproducing operation of the optical memory device 100 of FIG. 1.

FIG. 7 is a diagram showing energy bands in the reproducing operation of the optical memory device 100 of FIG. 1.

As shown in FIG. 3, in the recorded state of the optical memory device 100, electrons 200 are captured in the quantum well layer 130. A fourth light L4 is irradiated onto the optical memory device 100 in the recorded state. The fourth light L4 has energy $E_{W4}$ which satisfies the following Equation 6.

$$E_{CB2} - E_{CQW} > E_{W4} = h\nu_4 \quad (6)$$

A frequency $\nu_4$ of the fourth light L4 may be determined by Equation 6. The irradiated fourth light L4 applies energy $E_{W4}$ to the electron 200 captured in the quantum well layer 130 so as to excite the captured electron 200.

Since the energy $E_{W4}$ of the fourth light L4 is insufficient to make the electron 200 jump over the energy barrier of the second barrier layer 140, the excited electron 200 remains captured in the quantum well layer 130. The high energy of the excited electron 200 is transited to low energy and light Lr is emitted. Since a potential of the quantum well layer 130 is generally formed with a stepped-shape, the energy of the emitted light Lr is smaller than the energy $E_{W4}$ of the fourth light L4. That is, the frequency of the emitted light Lr is smaller than the frequency $\nu_4$ of the fourth light L4. When there is no electron 200 in the conduction band of the quantum well layer 130, the fourth light L4 transmits through the quantum well layer 130 without losing energy. Therefore, the photodetector 190 (see FIG. 1) may determine whether the optical memory device 100 to which the fourth light L4 is irradiated is in the recorded state or not by detecting the light Lr having a lower frequency than the frequency $\nu_4$ of the fourth light L4. That is, when the photodetector 190 detects the light Lr having a lower frequency than the frequency $\nu_4$ of the fourth light L4, the optical memory device 100 is in the recorded state. On the other hand, when the photodetector 190 does not detect the light Lr having a lower frequency than the frequency $\nu_4$ of the fourth light L4, the optical memory device 100 is in the non-recorded state.

The excited electron 200 may perform nonradiative relaxation through a thermal interaction without transiting to the lower energy status to emit the light Lr according to the energy band of the quantum well layer 130 and the magnitude of the energy $E_{W4}$ of the fourth light L4. In this exemplary embodiment, the electron 200 captured in the quantum well layer 130 absorbs the energy of the fourth light L4 without emitting light, the intensity of the fourth light L4 which is detected by the photodetector 190 is reduced. If the electron 200 in the quantum well layer 130 is not in the conduction band, the fourth light L4 transmits through the quantum well layer 130 without losing energy. Therefore, the photodetector 190 may be disposed under the optical memory device 100 to determine whether the optical memory device 100 is in the recorded state or the non-recorded state using the change in the intensity of the transmitted fourth light L4. That is, when the intensity of the fourth light L4 after transmitting through the quantum well layer 130 is substantially the same as the intensity of the irradiated fourth light L4 before transmitting through the quantum well layer 130, the optical memory device 100 is in the non-recorded state. On the other hand, if the intensity of the fourth light L4 after transmitting the quantum well layer 130 is lower than the intensity of the irradiated fourth light L4, the optical memory device 100 is in the recorded state.

In the above reproducing operation, since the electron 200 captured in the quantum well layer 130 remains in the quantum well layer 130, the recording state of the optical memory device 100 may be maintained.

Figure 8:
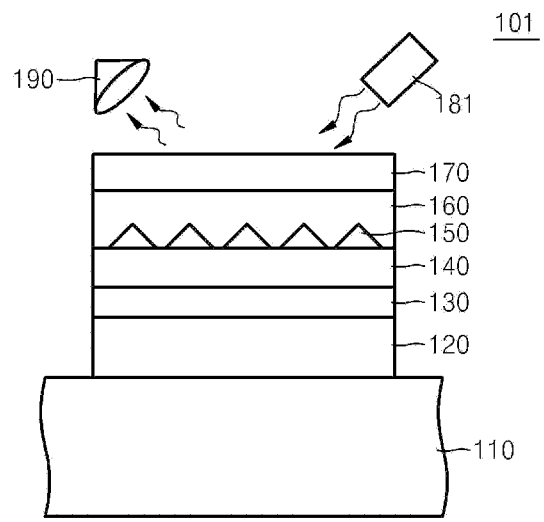
FIG. 8 is a cross-sectional view of an optical memory device according to another exemplary embodiment.
Figure 9:
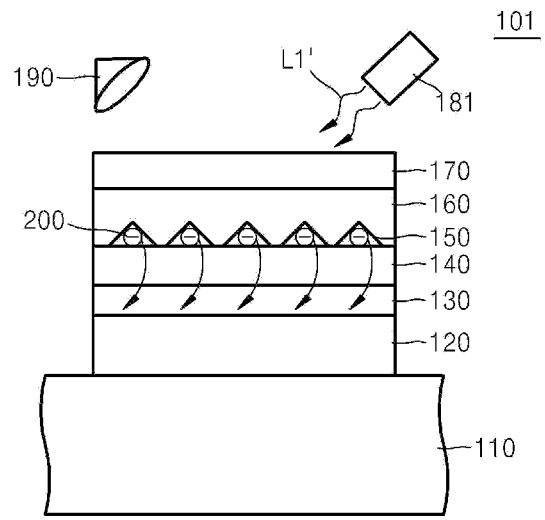
FIG. 9 is a diagram showing a recording operation of the optical memory device of FIG. 8.
Figure 10:
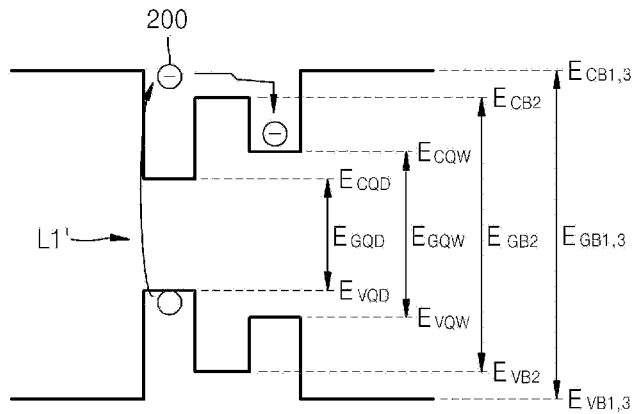
FIG. 10 is a diagram showing energy bands in the recording operation of the optical memory device of FIG. 8.

FIG. 8 is a cross-sectional view of an optical memory device 101 according to another exemplary embodiment, FIG. 9 shows a recording operation of the optical memory device 101 of FIG. 8, and FIG. 10 is a diagram showing energy bands in the recording operation of the optical memory device 101 of FIG. 8.

Referring to FIG. 8, the optical memory device 101 of the present exemplary embodiment includes a first barrier layer 120, a quantum well layer 130, a second barrier layer 140, a quantum dot layer 150, a third barrier layer 160, and the capping layer 170 which are stacked sequentially on the substrate 110. Moreover, the optical memory device 101 of the present exemplary embodiment may further include a light source 181 irradiating light for recording/reproducing operations, and the photodetector 190 detecting reflected light.

In the optical memory device 101, elements, except for the light source 181, are the same as those of the optical memory device 100 described with reference to FIGS. 1 through 7, and thus, detailed descriptions of the elements are not provided.

The light source 181 irradiates a first light L1' in the recording operation. The first light L1' has an energy $E_{W1'}$ which satisfies the following Equation 7.

$$E_{GQW} > E_{W1'} = h\nu_1 \geq E_{GQD} + (E_{CB2} - E_{CQD}) \quad (7)$$

A frequency $\nu_{1'}$ of the first light L1' may be determined by Equation 7. The energy $E_{W1'}$ of the irradiated first light L1' which is added to the energy band gap $E_{GQD}$ of the quantum dot layer 150, is equal to or greater than an energy barrier $E_{CB2}-E_{CQD}$ of the second barrier layer 140. Therefore, the irradiated first light L1' forms excitons, which are electron-hole pairs, in the quantum dot layer 150, and at the same time, the irradiated first light L1' may make the excited electrons 200 directly jump over the second barrier layer 140 from the valence band of the quantum dot layer 150 directly to the conduction band of the quantum well layer 130. As described above, at least some of the electrons with the energy $E_{W1'}$ are captured by the quantum well layer 130 to change states of corresponding cells in the optical memory device 101 to recorded states.

Operations of erasing the recorded information and reproducing the recorded information of the optical memory device 101 of the present exemplary embodiment are the same as those of the optical memory device 100 of the previous exemplary embodiment, and thus, detailed descriptions of the operations are not provided.

Figure 11:
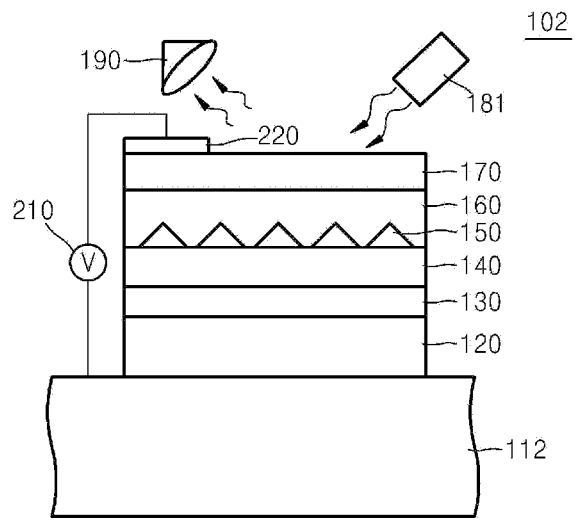
FIG. 11 is a cross-sectional view of an optical memory device according to another exemplary embodiment.
Figure 12:
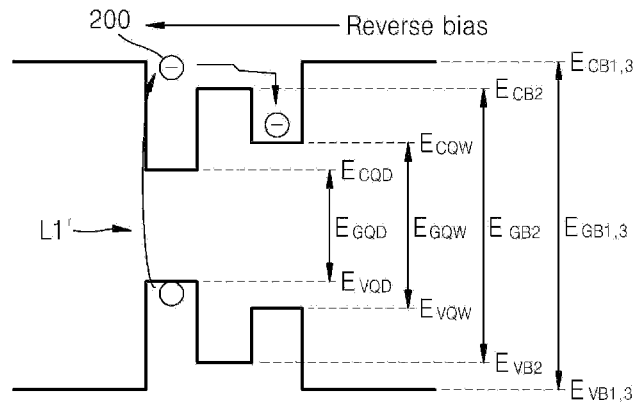
FIG. 12 is a diagram showing energy bands in a recording operation of the optical memory device of FIGS. 11.
Figure 13:
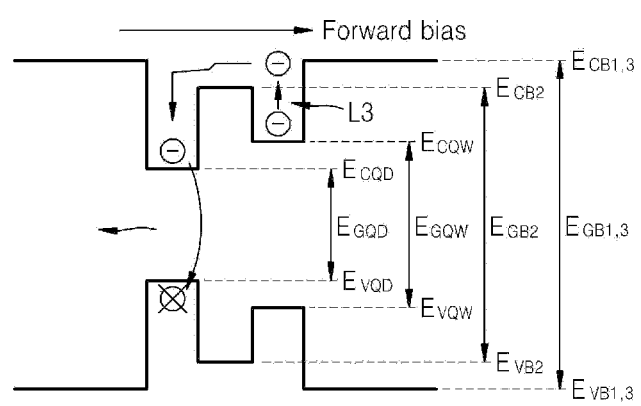
FIG. 13 is a diagram showing energy bands in an erasing operation of the optical memory device of 11.

FIG. 11 is a cross-sectional view of an optical memory device 102 according to another exemplary embodiment, and FIGS. 12 and 13 are diagrams showing energy bands in a recording operations of, and an erasing operation of the optical memory device 102 of FIG. 11, respectively.

Referring to FIG. 11, the optical memory device 102 of the present exemplary embodiment includes the first barrier layer 120, the quantum well layer 130, the second barrier layer 140, the quantum dot layer 150, the third barrier layer 160, and the capping layer 170 which are stacked sequentially on a substrate 112. Moreover, an upper electrode 220 is formed on a portion of the capping layer 170, and voltage source 210 is electrically connected to the upper electrode 220 and the substrate 112. The optical memory device 102 of the present exemplary embodiment may further include the light source 181 irradiating light for recording/reproducing information, and the photodetector 190 detecting reflected light. The substrate 112 may be formed of a conductive material. A lower electrode (not shown) may be disposed between the substrate 112 and the first barrier layer 120, and the voltage source 210 may be connected to the lower electrode instead of the substrate 112. The optical memory device 102 may include arranged cells in which unit information is recorded, and in this exemplary embodiment, electric wires may have a structure in which the voltage source 210 is applied independently to each of the cells on the first to third barrier layers 120, 140, and 160, the quantum well layer 130, and the quantum dot layer 150 formed on the substrate 112.

In the optical memory device 102 of the present exemplary embodiment, elements except for the electrical wiring structure are substantially the same as the elements of the optical memory device 101 described with reference to FIGS. 8 through 10, and thus, detailed descriptions of the elements are not provided.

According to the electric wiring structure of the optical memory device 102 of the present exemplary embodiment, there are potential differences between the first barrier layer 120, the quantum well layer 130, the second barrier layer 140, the quantum dot layer 150, and the third barrier layer 160 so as to control the movement of the excited excitons 200 effectively.

FIG. 12 is a diagram showing energy bands in the recording operation of the optical memory device 102. Referring to FIG. 12, when the recording operation is performed in the optical memory device 102, the first light L1' is irradiated, and at the same time, a reverse bias voltage is applied to the optical memory device 102, where the first light L1' has an energy which satisfies Equation 7. The reverse bias voltage makes an electric potential of the quantum well layer 130 higher than an electric potential of the quantum dot layer 150, the electrons 200 which are pair-produced and excited by the first light L1' in the quantum dot layer 150 are electrically forced to move from the quantum dot layer 150 to the quantum well layer 130 by the reverse bias voltage. Consequently, the excited electrons 200 in the quantum dot layer 150 may be efficiently captured by the quantum well layer 130, and the optical memory device 102 is in the recorded state.

FIG. 13 is a diagram shown energy bands in the erasing operation of the optical memory device 102 of the present exemplary embodiment. Referring to FIG. 13, when the recorded information is erased in the optical memory device 102 of the present exemplary embodiment, the third light L3 is irradiated, and at the same time, a forward bias voltage is applied to the optical memory device 102, where the third light L3 has an energy which satisfies Equation 5. The forward bias voltage makes the electric potential of the quantum well layer 130 lower than the electric potential of the quantum dot layer 150, and accordingly, the electrons 200 excited due to the third light L3 in the quantum well layer 130 are electrically forced to move to the quantum dot layer 150. Therefore, the excited electrons 200 in the quantum well layer 130 may be recombined with the holes in the quantum dot layer 150 efficiently, and thus, the optical memory device 102 returns to the initial state, that is, the non-recorded state.

The operation of reproducing information in the optical memory device 102 is substantially the same as that of the optical memory device 100 illustrated in FIG. 7, and thus, the detailed descriptions of the reproducing operation are not provided.

While exemplary embodiments have been particularly shown and described, it will be understood by those of ordinary skill in the art that various changes in form and details may be made therein without departing from the spirit and scope of the inventive concept as defined by the following claims.

The invention claimed is:

1. An optical memory device comprising:
a substrate;
a first barrier layer formed on the substrate;
a quantum well layer formed on the first barrier layer,
   wherein the quantum well layer has an energy band gap which is narrower than an energy band gap of the first barrier layer;
a second barrier layer formed on the quantum well layer,
   wherein the second barrier layer has an energy band gap which is wider than the energy band gap of the quantum well layer, and
   wherein the energy band gap of the second barrier layer is narrower than the energy band gap of the first barrier layer;
a quantum dot layer including a plurality of quantum dots formed on the second barrier layer,
   wherein the quantum dot layer has an energy band gap which is narrower than the energy band gap of the quantum well layer; and
a third barrier layer formed on the quantum dot layer,
wherein the third barrier layer has an energy band gap which is wider than the energy band gap of the second barrier layer, and
wherein a difference between a conduction band of the second barrier layer and a conduction band of the quantum dot layer is smaller than the energy band gap of the quantum dot layer.

2. The optical memory device of claim 1, wherein a difference between the conduction band of the second barrier layer and the conduction band of the quantum dot layer is smaller than a difference between a conduction band of the third barrier layer and a conduction band of the quantum well layer.

3. An optical memory device comprising:
a substrate;
a first barrier layer formed on the substrate;
a quantum well layer formed on the first barrier layer,
   wherein the quantum well layer has an energy band gap which is narrower than an energy band gap of the first barrier layer;
a second barrier layer formed on the quantum well layer,
   wherein the second barrier layer has an energy band gap which is wider than the energy band gap of the quantum well layer, and
   wherein the energy band gap of the second barrier layer is narrower than the energy band gap of the first barrier layer;
a quantum dot layer including a plurality of quantum dots formed on the second barrier layer,
   wherein the quantum dot layer has an energy band gap which is narrower than the energy band gap of the quantum well layer;
a third barrier layer formed on the quantum dot layer,
   wherein the third barrier layer has an energy band gap which is wider than the energy band gap of the second barrier layer; and
a light source which irradiates light of a first wavelength in an operation of recording information, which irradiates light of a second wavelength in an operation of erasing recorded information, and which irradiates light of a third wavelength in an operation of reproducing recorded information,
wherein the first wavelength, the second wavelength and the third wavelength are all different from each other.

4. The optical memory device of claim 3, wherein the light source simultaneously irradiates a first light and a second light in the operation of recording information,
   wherein the first light has an energy which is equal to or greater than the energy band gap of the quantum dot layer, and
   wherein the second light has an energy which is greater than a difference between a conduction band of the second barrier layer and a conduction band of the quantum dot layer.

5. The optical memory device of claim 4, wherein the energy of the first light is smaller than the energy band gap of the quantum well layer.

6. The optical memory device of claim 4, wherein the energy of the second light is smaller than the energy band gap of the quantum dot layer.

7. The optical memory device of claim 3, wherein the light source irradiates a first light in the operation of recording information,
   wherein the first light has an energy which is equal to or greater than a sum of the energy band gap of the quantum dot layer and a difference between a conduction band of the second barrier layer and a conduction band of the quantum dot layer.

8. The optical memory device of claim 7, wherein the energy of the first light is smaller than the energy band gap of the quantum well layer.

9. The optical memory device according to claim 3, wherein the light source irradiates a third light in the operation of erasing recorded information,
   wherein the third light has an energy which is equal to or greater than a difference between a conduction band of the second barrier layer and a conduction band of the quantum well layer.

10. The optical memory device of claim 9, wherein the energy of the third light is smaller than a difference between a conduction band of the first barrier layer and the conduction band of the quantum well layer.

11. The optical memory device according to claim 3, wherein the light source irradiates a fourth light in the operation of reproducing recorded information,
   wherein the fourth light has an energy which is smaller than a difference between a conduction band of the second barrier layer and a conduction band of the quantum well layer.

12. The optical memory device of claim 11, further comprising a photodetector which detects emitted light, if the fourth light is irradiated,
   wherein the detected emitted light has an energy lower than the energy of the fourth light.

13. The optical memory device of claim 11, further comprising a second photodetector which detects the irradiated fourth light if the fourth light is irradiated from the light source.

14. An optical memory device comprising:
a substrate;
a first barrier layer formed on the substrate;
a quantum well layer formed on the first barrier layer,
   wherein the quantum well layer has an energy band gap which is narrower than an energy band gap of the first barrier layer;
a second barrier layer formed on the quantum well layer,
   wherein the second barrier layer has an energy band gap which is wider than the energy band gap of the quantum well layer, and wherein the energy band gap of the second barrier layer is narrower than the energy band gap of the first barrier layer;

a quantum dot layer including a plurality of quantum dots formed on the second barrier layer, wherein the quantum dot layer has an energy band gap which is narrower than the energy band gap of the quantum well layer;

a third barrier layer formed on the quantum dot layer, wherein the third barrier layer has an energy band gap which is wider than the energy band gap of the second barrier layer; and a voltage source which generates differences between electric potentials of the first barrier layer, the quantum well layer, the second barrier layer, the quantum dot layer, and the third barrier layer.

15. The optical memory device of claim 14, further comprising an upper electrode disposed on the third barrier layer, wherein the upper electrode is electrically connected to the voltage source.

16. The optical memory device of claim 14, wherein the substrate is formed of a conductive material and is electrically connected to the voltage source.

17. The optical memory device according to claim 14, wherein the voltage source applies a reverse bias voltage in an operation of recording information, wherein the reverse bias voltage makes the electric potential of the quantum well layer higher than that of the quantum dot layer.

18. The optical memory device according to claim 14, wherein the voltage source applies a forward bias voltage in an operation of erasing recorded information, wherein the forward bias voltage makes the electric potential of the quantum well layer lower than that of the quantum dot layer.

19. The optical memory device according to claim 1, wherein the first barrier layer, the second barrier layer, the third barrier layer, the quantum well layer, and the quantum dot layer are each formed of a GaAs-based compound semiconductor.

20. The optical memory device according to claim 1, further comprising a capping layer formed on the third barrier layer.

21. A method of recording/reproducing information on/from an optical memory device, which comprises a substrate; a first barrier layer formed on the substrate; a quantum well layer formed on the first barrier layer, the quantum well layer having an energy band gap which is narrower than an energy band gap of the first barrier layer; a second barrier layer formed on the quantum well layer, the second barrier layer having an energy band gap which is wider than the energy band gap of the quantum well layer, the energy band gap of the second barrier layer being narrower than the energy band gap of the first barrier layer; a quantum dot layer including a plurality of quantum dots formed on the second barrier layer, the quantum dot layer having an energy band gap which is narrower than the energy band gap of the quantum well layer; and a third barrier layer formed on the quantum dot layer, the third barrier layer having an energy band gap which is wider than the energy band gap of the second barrier layer, the method comprising:

irradiating light of a first wavelength in an operation of recording information on the optical memory device;

irradiating light of a second wavelength in an operation of erasing recorded information from the optical memory device; and irradiating light of a third wavelength in an operation of reproducing recorded information from the optical memory device, wherein the first wavelength, the second wavelength and the third wavelength are all different from each other.

22. The method of claim 21, further comprising irradiating a first light and a second light to the optical memory device in the operation of recording information, wherein the first light has an energy which is equal to or greater than the energy band gap of the quantum dot layer, and wherein the second light has an energy which is greater than a difference between a conduction band of the second barrier layer and a conduction band of the quantum dot layer.

23. The method of claim 22, wherein the energy of the first light is smaller than the energy band gap of the quantum well layer.

24. The method of claim 22, wherein the energy of the second light is smaller than the energy band gap of the quantum dot layer.

25. The method of claim 21, further comprising irradiating a first light to the optical memory device in the operation of recording information, wherein the first light has an energy which is equal to or greater than a sum of the energy band gap of the quantum dot layer and a difference between a conduction band of the second barrier layer and a conduction band of the quantum dot layer.

26. The method of claim 25, wherein the energy of the first light is smaller than the energy band gap of the quantum well layer.

27. The method according to claim 21, further comprising irradiating a third light to the optical memory device in the operation of erasing information, wherein the third light has an energy which is equal to or greater than a difference between a conduction band of the second barrier layer and a conduction band of the quantum well layer.

28. The method of claim 27, wherein the energy of the third light is smaller than a difference between a conduction band of the first barrier layer and the conduction band of the quantum well layer.

29. The method according to claim 21, further comprising irradiating a fourth light to the optical memory device in the operation of reproducing recorded information, the fourth light having an energy which is smaller than a difference between a conduction band of the second barrier layer and a conduction band of the quantum well layer.

30. The method of claim 29, further comprising, if the fourth light is irradiated, then detecting emitted light which has an energy lower than the energy of the fourth light.

31. The method of claim 29, further comprising, if the fourth light is irradiated, then detecting the fourth light which is transmitted through the optical memory device.

32. The method according to claim 21, further comprising generating differences between electric potentials of the first barrier layer, the quantum well layer, the second barrier layer, the quantum dot layer, and the third barrier layer.

33. The method of claim 32, further comprising applying a reverse bias voltage to the optical memory device in the operation of recording information, wherein the reverse bias voltage makes the electric potential of the quantum well layer higher than that of the quantum dot layer is.

34. The method of claim 32, further comprising applying a forward bias voltage to the optical memory device in the operation of erasing recorded information,
  wherein the forward bias voltage makes the electric potential of the quantum well layer lower than that of the quantum dot layer.

\* \* \* \* \*